United States Patent
Golab et al.

(10) Patent No.: US 10,256,193 B1
(45) Date of Patent: Apr. 9, 2019

(54) METHODS AND DEVICES WITH ENHANCED GROUNDING AND SHIELDING FOR WIRE BOND STRUCTURES

(71) Applicant: NXP USA, Inc., Austin, TX (US)

(72) Inventors: James S. Golab, Austin, TX (US); Robert Joseph Wenzel, Austin, TX (US); Stanley Andrew Cejka, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/826,205

(22) Filed: Nov. 29, 2017

(51) Int. Cl.
| | |
|---|---|
| H01L 23/552 | (2006.01) |
| H01L 23/00 | (2006.01) |
| H01L 23/492 | (2006.01) |
| H01L 21/48 | (2006.01) |
| H01L 23/498 | (2006.01) |

(52) U.S. Cl.
CPC ........ *H01L 23/552* (2013.01); *H01L 21/4853* (2013.01); *H01L 21/4871* (2013.01); *H01L 23/492* (2013.01); *H01L 23/49838* (2013.01); *H01L 24/48* (2013.01); *H01L 2224/48227* (2013.01); *H01L 2924/3025* (2013.01)

(58) Field of Classification Search
None
See application file for complete search history.

(56) References Cited

U.S. PATENT DOCUMENTS

| | | | |
|---|---|---|---|
| 7,727,801 B2 | 6/2010 | Saran | |
| 8,253,259 B2 | 8/2012 | Haba et al. | |
| 8,987,889 B2 | 3/2015 | Welch et al. | |
| 9,508,703 B2 * | 11/2016 | Yu | H01L 23/3114 |
| 2006/0180916 A1 | 8/2006 | Wyland | |
| 2008/0246126 A1 * | 10/2008 | Bowles | H01L 23/3114 257/659 |
| 2008/0315396 A1 | 12/2008 | Kuhlman et al. | |
| 2013/0307128 A1 * | 11/2013 | Lin | H01L 23/552 257/659 |

* cited by examiner

*Primary Examiner* — Dung A. Le (57) ABSTRACT

A semiconductor device includes a package substrate, a semiconductor die attached to a first major surface of the package substrate, and a plurality of wire bonds attached between the semiconductor die and the first major surface of the package substrate. The device further includes a conductive plate over the semiconductor die, plurality of wire bonds, and package substrate wherein a first major surface of the conductive plate faces the first major surface of the package substrate. The device further includes a plurality of conductive extensions attached to the first major surface of the conductive plate, wherein each conductive extension extends from the first major surface of the conductive plate and between two adjacent wire bonds of the plurality of wire bonds.

18 Claims, 5 Drawing Sheets

METHODS AND DEVICES WITH ENHANCED GROUNDING AND SHIELDING FOR WIRE BOND STRUCTURES

BACKGROUND

Field

This disclosure relates generally to semiconductor devices, and more specifically, to methods and devices with enhanced grounding and shielding for wire bond structures.

Related Art

Semiconductor devices often include wire bonds between electronic devices such as processing die or other active circuitry and substrates. Bond pads of the electronic device can be placed relatively close together to maximize the number of signals communicated between the electronic device and other devices. Corresponding wire bond pads on the substrate are typically spread out over a larger area. Wire bonds present a complex three-dimensional electrical environment to signals traversing them due to both variable impedance and coupling of signals with neighboring wire bonds. The effects degrade the signal integrity through reflections and from crosstalk, especially as the number of connections to the semiconductor is increased and the spacing between the connections is decreased.

Wire bonds are constructed as rising from the surface of the die, bending over in a series of curves, and landing on a substrate at a different horizontal height than the die. If the ground reference is provided only by wires connected between the die and the substrate, then the proximity of the ground wires to the signal wires is dictated by the bonding rules to several times the wire diameter, and the reference impedance will change at each point along the wire. In addition, when multiple signals traverse wire bonds adjacent to each other, the larger distance to any nearby reference will result in increased cross-coupling of signals, with the interference often extending out to many adjacent signals.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of methods and devices are disclosed that take advantage of wirebond fanout in which wirebond pads are closer together on the die, than are the bond pads (or bond posts) on a substrate. With the fanout, the wire-to-wire spacing increases with increasing distance from the die, presenting an opportunity to fit additional grounding and shielding structures between the wires to reduce the effects of reflections and crosstalk between adjacent wirebonds. The various structures can be wires, fins, vanes, or any other shapes contoured to follow and isolate the wirebond wires in the fanout region. With the proliferation of stacked semiconductor structures, opportunities arise to provide these structures separately above the die. Also, the possibility for a closer proximity of the shielding structures to the signal wires is provided than is achievable with the die-to-substrate wires alone.

Figure 1:
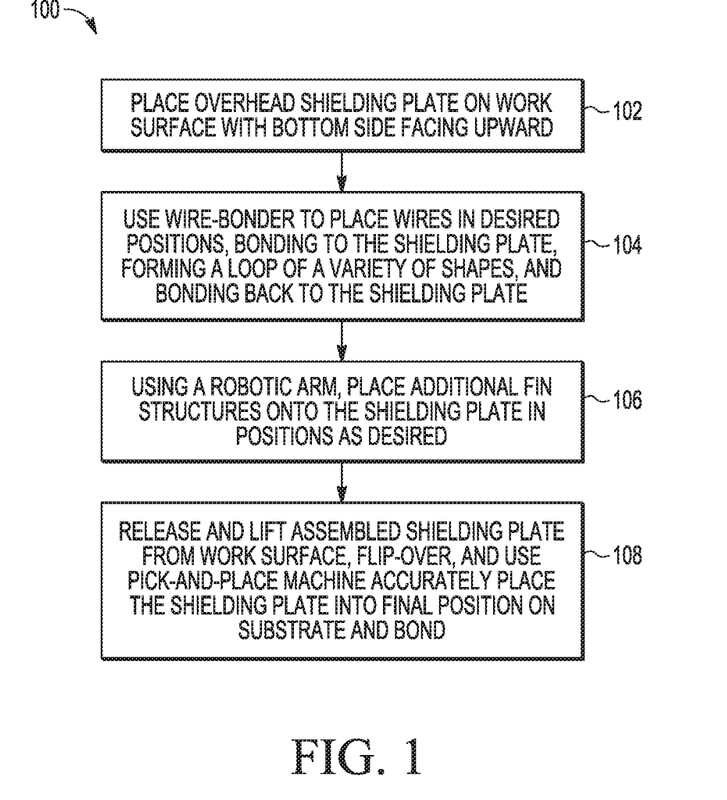
FIG. 1 illustrates a flow diagram of a method for enhancing grounding and shielding in semiconductor devices in accordance with selected embodiments of the invention.

FIG. 1 illustrates a flow diagram of a method 100 for enhancing grounding and shielding in semiconductor devices in accordance with selected embodiments of the invention. Process 102 can include placing a structure such as a flat plate on a work surface with a bottom side facing upward. The bottom side of the plate refers to a side that will be facing another surface on which wirebonds have been formed. The plate can be made of conductive and relatively inflexible material. In some embodiments, the plate serves as a ground plane, but other voltage levels can be applied to the plate, depending on the application.

In process 104, conductive loops, wire, and/or other suitable shielding structures that can be formed with a wirebonding process can be added on the bottom side of the plate. The shielding structures are located to coincide with areas between wirebonds on a facing surface. The wire may be fastened to the bottom of the plate at one or both ends. The shape and size of the shielding structures may be similar to the shape or outline of wirebonds that will be adjacent to either side of the shielding structures on a facing surface when the plate is positioned over the facing surface.

Other shielding structures may be bonded, fastened, attached and/or mounted on the bottom of the plate in process 106. The structures can be relatively thin conductive fins, plates, disks or other structures that are located to coincide with areas between wirebonds on a facing surface. The shielding structures may be fastened to the bottom of the plate at one or more places. The shape of the shielding structures may be similar to the shape or outline of wirebonds that will be adjacent to either side of the shielding structures on a facing surface when the plate is positioned over the facing surface.

The shielding structures attached to the plate are intended to reduce cross-talk or interference between sensitive signals in wires on a surface or assembly facing the bottom side of the plate when the plate is mounted over the wires. The wires on the facing surface can be wirebonds between an integrated circuit die and leads on a leadframe or other chip carrier, or other wires that are used to communicate signals between components. The shielding structures may be placed manually, with a robotic arm, or other mechanism for placing the shielding structures in a desired location. Examples of suitable means for attaching the shielding structures includes conductive epoxy or other adhesive, brazing, laser attachment, or other suitable technique that creates or maintains a conductive connection between the plate and the shielding structure.

In process 108, the plate is released from the work surface and placed over the facing surface or assembly with the wires to be shielded so that the bottom side of the plate and the shielding structures face the assembly with the wires to be shielded. A pick and place machine, robotic arm, or other suitable mechanism can be used to accurately place the shielding plate into position. Once positioned, the shielding plate can be retained in place using a suitable adhesive or other suitable material or mechanism.

Figure 2:
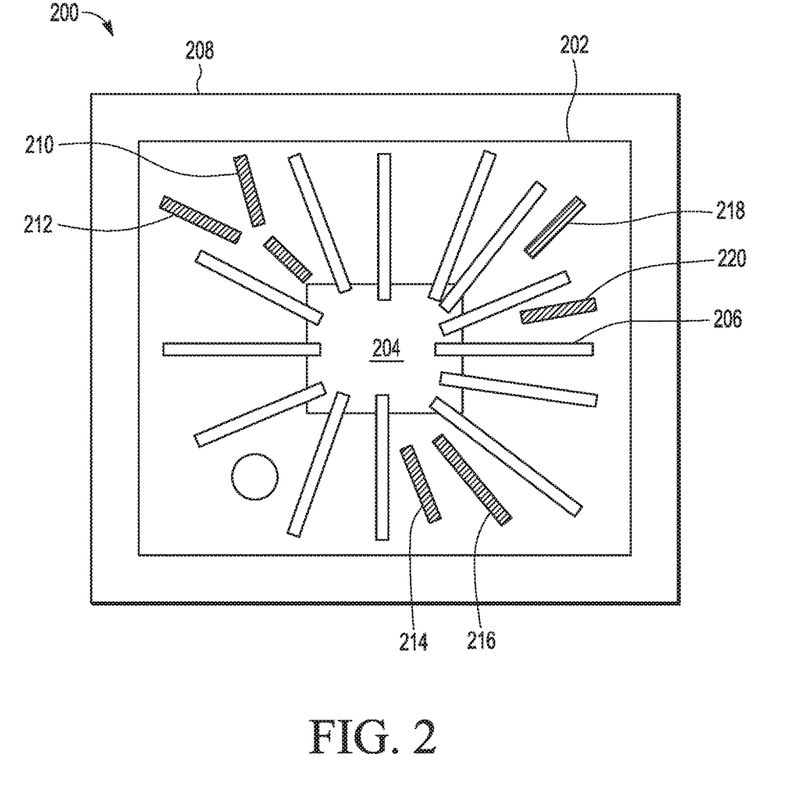
FIG. 2 illustrates a top transparent view of a semiconductor device in accordance with selected embodiments of the invention.

FIG. 2 illustrates a top transparent view of a semiconductor device 200 in accordance with selected embodiments of the invention that includes package substrate 202, integrated circuit (IC) die 204, wirebonds 206 between IC die 204 and conductive structures such as lead fingers or bond pads (not shown) on substrate 202, plate 208 overlying substrate 202, IC die 204 and wirebonds 206, and shielding structures 210, 212, 214, 216, 218, 220.

As wirebonds fan out from IC die 204 to the point where they are attached to substrate 202, more space is available between wirebonds 206 where wirebonds 206 are attached to substrate 202 than at IC die 204. The fan out between wirebonds 206 may vary, i.e., there may be more space between some pairs of adjacent wirebonds 206 than others. Shielding structures 210-220 can be positioned where there is greater space in the fan out between wirebonds 206, such as at the point where wirebonds 206 are attached to substrate 202. In the example shown, shielding structures 210 and 212 are positioned near the end of the fan out between a first set of adjacent wirebonds 206. Shielding structures 214, 216 are positioned between a second set of adjacent wirebonds 206. Shielding structure 218 is positioned between a third set of adjacent wirebonds 206, and shielding structure 220 is positioned between a fourth set of adjacent wirebonds 206. Note that other numbers and configurations of shielding structures 210-220 can be used along with other configurations of substrate 202, IC die 204, and wirebonds 206 or other conductive lines through which signals are conducted.

Plate 208 is placed over IC die 204 and substrate 202 assembly with shielding structures 210-220 forming "dropdown" grounding or shielding structures. Shielding structures 210-220 can be wirebonds or other conductive fins, filaments, or other structures placed so as to come down and intervene between sensitive signals to provide additional shielding. This requires adequate spacing between existing wirebonds 206, which is often found in lower signal-count high-performance wirebond RF modules, leadframes and QFN-style packages.

In one example, a wirebonder can place wirebonds within a few micrometers of target position and is routinely capable of placing 0.8 to 2 milli-inch (mil) (about 20 to 50 micrometer (μm)) diameter wires on a 40 um to 150 um pitch at IC die 204, and fanning-out to a pitch of 150 um to 250 um and more at the bond posts on substrate 202. Despite these technological capabilities, there are still many cases where improved ground shielding is desired. Plate 208 and shielding structures 210-220 provide grounding from above IC die 204/substrate 202 assembly, assuming plate 208 is grounded. Effective shielding is provided when shielding structures 210-220 contact both substrate 202 and IC die 204, although some shielding (mainly capacitive shielding) is provided by the mere presence of plate 208 and shielding structures 210-220, even if plate 208 and shielding structures 210-220 do not contact either IC die 204, substrate 202, or both.

In many cases, wirebonds 206 fan out at a sufficient angle to allow shielding structures 210-220 to be placed in-between wirebonds 206. A pick-and-place machine can be used to place plate 208 very precisely so that shorts do not occur. Additionally, dielectric coatings may be used on shielding structures 210-220 to protect wirebonds 206 and IC die 204 from unintended contact.

Figure 3:
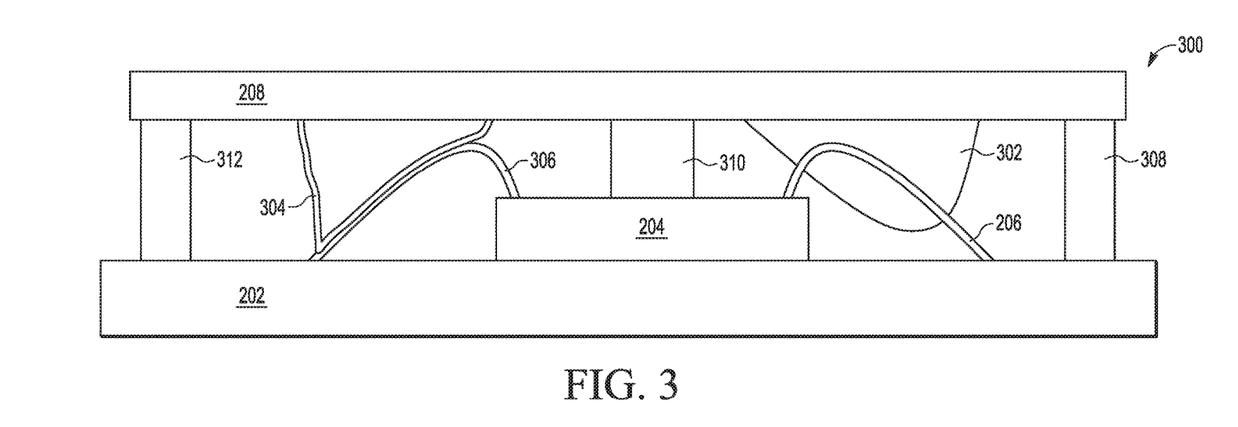
FIG. 3 illustrates a side view of a semiconductor device in accordance with selected embodiments of the invention.

FIG. 3 illustrates a side view of a semiconductor device 300 in accordance with selected embodiments of the invention that includes substrate 202, IC die 204, wirebonds 206, 306 between IC die 204 and substrate 202, plate 208 with shielding structures 302, 304, and support structures 308, 312 between plate 208 and substrate 202, or support structure 310 between plate 208 and die 204, that separate plate 208 from substrate 202 and die 204 by a desired distance. Plate 208 can be made of conductive material to which a desired level of voltage, such as ground or other voltage level, is applied. The thickness of shielding structures 302 and 304 is chosen so that shielding structures 302 and 304 can fit between wirebonds that are adjacent to wirebonds 306, 206 and wirebonds 306, 206 themselves. Wirebond 206 is adjacent to shielding structure 302, and wirebond 306 is adjacent to shielding structure 304.

Shielding structure 302 is made of a thin, solid piece of conductive material that is cut, formed or punched to a desired shape, such as an inverted asymmetrical fin shape shown in FIG. 3. A base portion of the fin is attached, bonded, mounted, fastened or otherwise connected to the bottom surface of plate 208. Shielding structure 302 extends toward but does not touch substrate 202 and is positioned to overlap at least a portion of wirebond 206 when viewed from the side as in FIG. 3.

Shielding structure 304 is a wirebond made of conductive wire having a V-shape with both ends attached to the bottom surface of plate 208. The left leg of the V of shielding structure 304 descends from plate 208 toward substrate 202. The vertex of the V-shape of shielding structure 304 is aligned with wirebond 306 near the top surface of substrate 202. The right leg of shielding structure 304 ascends to plate 208 and is aligned with the profile of a portion of wirebond 306 from the side view. The alignment of at least a portion of the side cross-sections of shielding structure 304 and wirebond 306 helps prevent interference with signals conducted in wirebond 306 by signals conducted in wirebonds adjacent to wirebond 306.

Support structures 308, 310, 312 are non-conductive pillars or posts positioned within the perimeters of plate 208 and substrate 202. Support structures 308, 312 extend from the bottom surface of plate 208 to the top surface of substrate 202. Support structure 310 extends from the bottom surface of plate 208 to the top surface of die 204. Support structures 308, 310, 312 are formed of material capable of withstanding compressive force so that a desired distance is maintained between plate 208 and substrate 202, and between plate 208 and die 204. In particular, wirebonds 206, 306 do not touch the bottom surface of plate 208 and shielding structures 302, 304 do not touch the top surface of substrate 202.

Support structures 308, 310, 312 can be attached, bonded, mounted, fastened or otherwise connected to the bottom surface of plate 208 and respective top surfaces of substrate 202 and die 204. The thickness of the wire used for shielding structure 304 and the material used for shielding structure 302 can be chosen based on the amount of space available between adjacent wirebonds. Different thickness of material or wire can be used for different shielding structures 302, 304.

Figure 4:
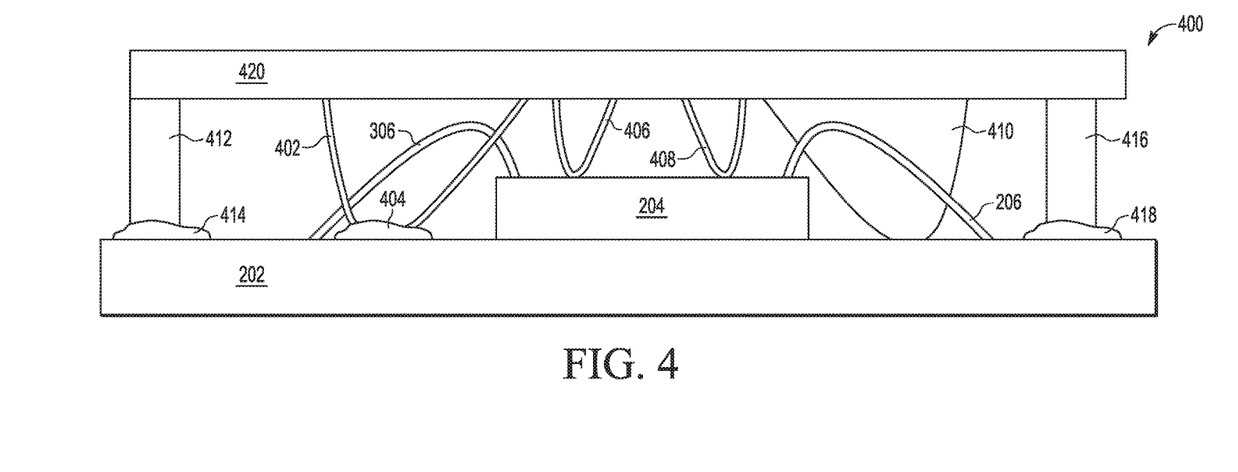
FIG. 4 illustrates a side view of a semiconductor device in accordance with selected embodiments of the invention.

FIG. 4 illustrates a side view of a semiconductor device 400 in accordance with selected embodiments of the invention that includes substrate 202, IC die 204, wirebonds 206, 306 between IC die 204 and substrate 202, plate 420 with shielding structures 402, 406, 408, 410 and support structures 416, 412 between plate 420 and substrate 202, and between plate 420 and die 204, that separate plate 420 from substrate 202 by a desired distance. Plate 420 can be made of conductive material to which a desired level of voltage, such as ground or other voltage level, is applied. The thickness of shielding structures 402, 406, 408, 410 is chosen so that shielding structures 402, 406, 408, 410 can fit between wirebonds that are adjacent to wirebonds 306, 206 and wirebonds 306, 206 themselves. Shielding structures 406, 408 are wirebonds with ends that are attached to the bottom surface of plate 420 and a V-shape that extends to and is in contact with the top surface of die 204. Wirebond 206 is adjacent shielding structure 410, and wirebond 306 is adjacent shielding structure 402.

Shielding structure 402 is a wirebond made of conductive wire having a V-shape with both ends attached to the bottom surface of plate 420. The left leg of the V of shielding structure 402 descends from plate 420 toward substrate 202. The vertex of the V-shape of shielding structure 402 is in contact with the top surface of substrate 202 and held in contact with substrate 202 with a conductive adhesive 404 such as epoxy or other suitable adhesive. The right leg of shielding structure 402 ascends to plate 420. The alignment of at least a portion of the side cross-sections of shielding structure 402 and wirebond 306 helps prevent interference with signals conducted in wirebond 306 by signals conducted in wirebonds (not shown) adjacent to wirebond 306.

Shielding structure 410 is made of a thin, solid piece of conductive material that is cut, formed or punched to a desired shape, such as an inverted asymmetrical fin shape shown in FIG. 4. A base portion of the fin is attached, bonded, mounted, fastened or otherwise connected to the bottom surface of plate 420. Shielding structure 410 extends toward and is in contact with substrate 202, and is positioned to be aligned with or overlap at least a portion of wirebond 206 when viewed from the side as in FIG. 4.

Support structures 416, 412 are conductive pillars or posts positioned within the perimeters of plate 420 and substrate 202. Support structures 416, 412 extend from the bottom surface of plate 420 to the top surface of substrate 202. Support structures 416, 412 are formed of material capable of withstanding compressive force so that a desired distance is maintained between plate 420 and substrate 202.

Support structures 416, 412 can be attached, bonded, mounted, fastened or otherwise connected to the bottom surface of plate 420 and respective top surfaces of substrate 202. A layer or patch of conductive adhesive 414, 418 such as epoxy or other suitable material can be used to retain support structures 416, 412 in contact with substrate 202. The thickness of the wire used for shielding structures 402, 406, 408 and the material used for shielding structure 410 can be chosen based on the amount of space available between adjacent wirebonds. Different thickness of material or wire can be used for different shielding structures 402, 406, 408, 410.

Figure 5:
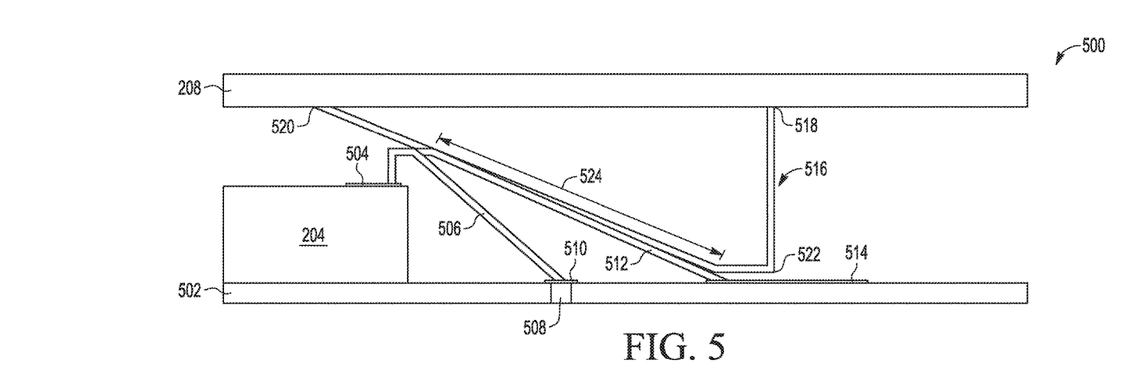
FIG. 5 illustrates a side view of a semiconductor device in accordance with selected embodiments of the invention.
Figure 6:
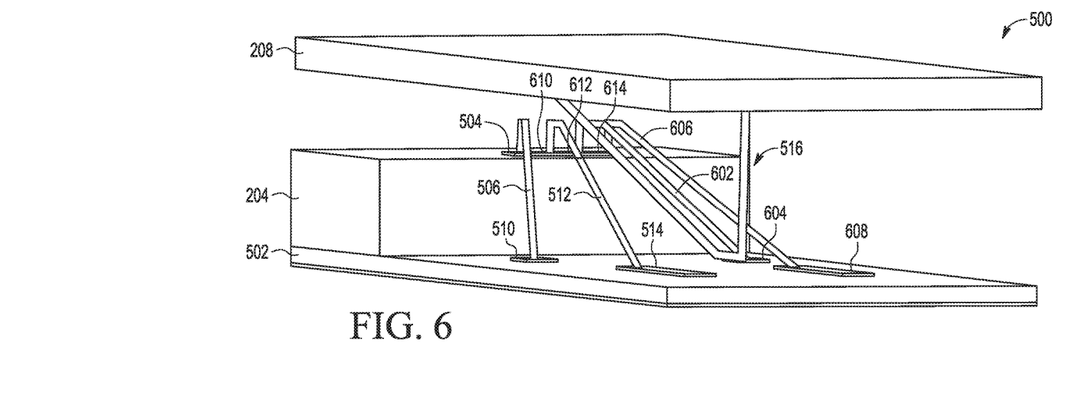
FIG. 6 illustrates a perspective view of the semiconductor device of FIG. 5.

Referring to FIGS. 5 and 6, FIG. 5 illustrates a side view of a semiconductor device 500 in accordance with selected embodiments of the invention that includes substrate 502 such as a printed circuit board or other suitable structure on which semiconductor die 204 is mounted. FIG. 6 illustrates a perspective view of the semiconductor device 500 of FIG. 5. Wirebonds 506, 512, 602, 606 are formed between respective bonding pads 504, 610, 612, 614 on semiconductor die 204 and bond pads 510, 514, 604, 608 on substrate 502. Bond pads 510, 514, 604, 608 may be formed on a conductive trace or other element on or in substrate 502 to connect semiconductor die 204 with one or more other components. Via 508 is formed through substrate 502 under bond pad 510 to allow semiconductor die to be connected to external components. Additional vias (not shown) may be formed under bond pads 514, 608, 604.

Semiconductor device 500 also includes conductive extensions formed as wirebond 516 with one end 518 attached at a first location on conductive plate 208 and another end 520 attached at a second location on conductive plate 208 some distance away from the first location 518. Wirebond 516 extends from first end 518 toward the facing surface of substrate 502 and includes bend 522 with a shape that changes the direction of wirebond 516 to be parallel to substrate 502 for a portion, and then toward the direction of the second location where end 520 is attached. A portion 524 of wirebond 516 between bend 522 and end 520 has a similar profile to the profile of a portion of wirebond 512, and is shown in the side view of FIG. 5 as being almost coincident in a plane containing portion 524 of wirebond 516 and a corresponding portion of wirebond 512. Wirebond 516 does not touch any surface of substrate 502, wirebonds 512, 506, or other component of device 500 except ends 518, 520 that are attached to conductive plate 208.

Wirebond 516 is positioned between wirebond 512 and wirebond 602, so wirebond 516 will have a greater effect in reducing the effects of reflections and crosstalk in wirebonds 512 and 602 than in wirebonds 506 and 512, or in wirebonds 602 and 606. Additional wirebonds 516 could be included in different locations on conductive plate 208 to reduce reflections and cross-talk between as many wirebonds 506, 512, 602, 606 as desired, however. The shapes of additional wirebonds 516 can be varied according the shapes of adjacent wirebonds 506, 512, 602, 606 to reduce reflections and cross-talk to a specified extent. A voltage supply, such as ground or other suitable voltage, may be connected to conductive plate 208, causing the voltage to be applied to wirebond 516 through the connections of wirebond 516 to conductive plate 208 at ends 518, 520.

Figure 7:
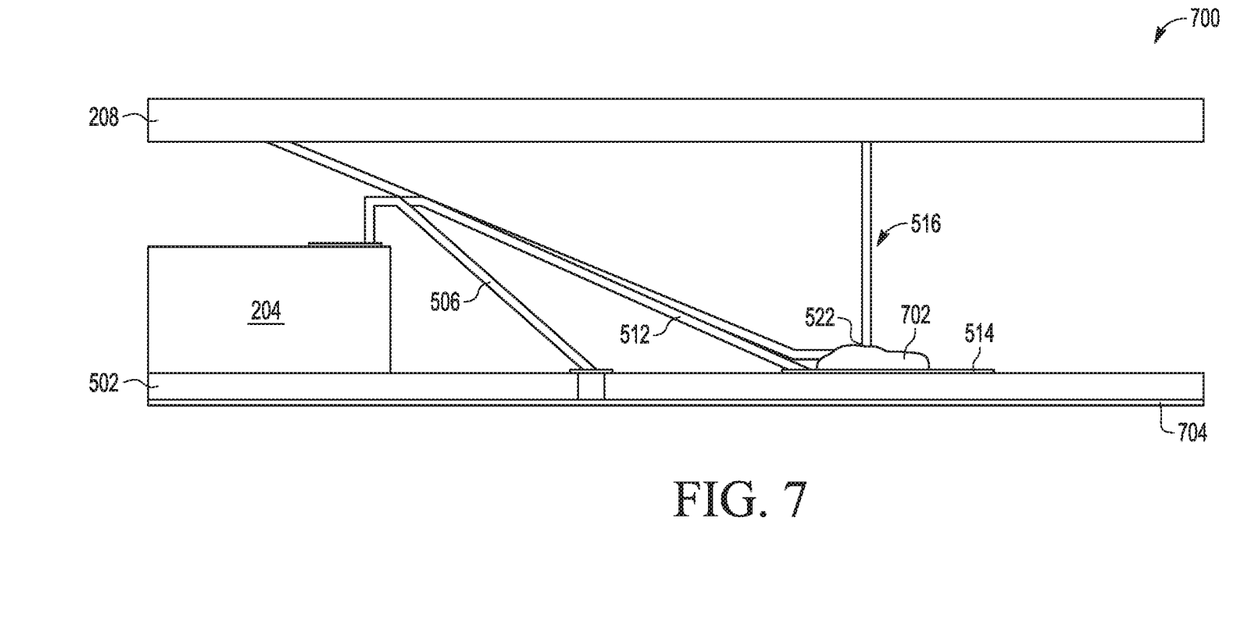
FIG. 7 illustrates a side view of a semiconductor device in accordance with selected embodiments of the invention.

FIG. 7 illustrates a side view of a semiconductor device 700 in accordance with selected embodiments of the invention. Semiconductor device 700 is similar to semiconductor device 500 of FIGS. 5 and 6, however, wirebond 516 is attached to substrate 502 with a portion of conductive epoxy 702 at bend 522, which is the smallest distance between wirebond 516 and the facing surface of substrate 502. Conductive epoxy 702 causes wirebond 516 to be conductively connected to surface pad 514 and then to ground plane 704 of substrate 502 through a conductive substrate via between pad 514 or other means, and which is also connected to conductive plate 208 to ground it as well. Grounding of wire 516 and plate 208 to the substrate ground plane 704, along with placing wire 516 as a shielding structure between wirebonds 512, 602 (FIG. 6), further decreases reflection and cross-talk between wirebonds 512, 602.

By now it should be appreciated that in some embodiments, there has been provided a semiconductor device that can include a package substrate (202), a semiconductor die (204) attached to a first major surface of the package substrate, a plurality of wire bonds (306) attached between the semiconductor die and the first major surface of the package substrate, and a conductive plate (208, 420) over the semiconductor die, plurality of wire bonds, and package substrate. A first major surface of the conductive plate faces the first major surface of the package substrate. A plurality of conductive extensions (304, 302, 402, 410, 516) is attached to the first major surface of the conductive plate. Each conductive extension extends from the first major surface of the conductive plate and between two wire bonds of the plurality of wire bonds.

In another aspect, each of the plurality of conductive extensions can extend between two wire bonds of the plurality of wire bonds to the first major surface of the package substrate (202, 502).

In another aspect, each extension can be electrically coupled to the conductive plate and the conductive plate can be electrically coupled to a first voltage supply node of the package substrate.

In another aspect, the semiconductor device can further comprise a second plurality of extensions (406, 408) attached to the first major surface of the conductive plate which extend to contact a conductive landing pad on the semiconductor die.

In another aspect, each of the plurality of conductive extensions can comprise a wire (304, 402, 516) which extends from the first major surface of the conductive plate and between two wire bonds of the plurality of wire bonds.

In another aspect, each wire (304, 402, 516) can extend to the first major surface of the package substrate (202, 502).

In another aspect, each wire (304, 402, 516) can loop back to the first major surface of the conductive plate and can be connected, at both ends, to the first major surface of the conductive plate (208, 420).

In another aspect, each wire that loops back to the first major surface of the conductive plate can contact conductive epoxy (404, 702) on the first major surface of the package substrate.

In another aspect, each wire can be electrically connected to the first major surface of the conductive plate and wherein the conductive plate can be coupled to a first voltage supply node of the package substrate.

In another aspect, each of the plurality of extensions (302, 410) can comprise a first sidewall adjacent a first wire bond and a second sidewall adjacent a second wire bond that is directly adjacent the first wire bond.

In another aspect, each extension (302, 410). can include a solid conductive material between the first and second sidewall In another aspect, each extension (302, 410) can have a wedge shape between the first and second wire bonds.

In other selected embodiments, a method (100) for forming a semiconductor device can comprise forming a conductive plate having conductive extensions on a first major surface of the conductive plate (steps 102-106). After forming the conductive planes having the conductive extensions, the plate is placed over a package substrate (step 108) having a semiconductor die attached to a first major surface of the package substrate, and a plurality of wire bonds attached between the semiconductor die and the first major of the package substrate. Placing the plate can be performed such that the first major surface of the conductive plate faces the first major surface of the package substrate and at least one extension of the conductive plate extends between two wire bonds of the plurality of wire bonds.

In another aspect, placing the plate over the package substrate can be performed such that each of the plurality of conductive extensions extends between two wire bonds of the plurality of wire bonds and contacts the first major surface of the package substrate.

In another aspect, after placing the plate, each extension can be electrically coupled to the conductive plate and the conductive plate can be electrically coupled to a first voltage supply node of the package substrate.

In another aspect, forming the conductive plate can comprise forming the conductive extensions by wire bonding wires (step 104) onto the first major surface of the conductive plate.

In another aspect, forming the conductive plate can comprise forming the conductive extensions by attaching conductive fins (step 106) onto the first major surface of the conductive plate.

In another aspect, placing the conductive plate over the package substrate can be performed using a pick-and-place machine (108).

In other selected embodiments, a semiconductor device can comprise a package substrate (202), a semiconductor die (204) attached to a first major surface of the package substrate, a plurality of wire bonds (306) attached between the semiconductor die and the first major surface of the package substrate, and a conductive plate (208, 420) over the semiconductor die, plurality of wire bonds, and package substrate. A first major surface of the conductive plate faces the first major surface of the package substrate. A plurality of conductive extensions (304, 302, 402, 410, 516) are attached to the first major surface of the conductive plate and electrically coupled to the conductive plate. Each conductive extension includes a wire which extends from the first major surface of the conductive plate and between two adjacent wire bonds of the plurality of wire bonds.

In another aspect, each wire (304, 402, 516) loops back to the first major surface of the conductive plate and is connected, at both ends, to the first major surface of the conductive plate.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device, comprising:
   a package substrate;
   a semiconductor die attached to a first major surface of the package substrate;
   a plurality of wire bonds attached between the semiconductor die and the first major surface of the package substrate;
   a conductive plate over the semiconductor die, plurality of wire bonds, and package substrate wherein a first major surface of the conductive plate faces the first major surface of the package substrate;
   a plurality of conductive extensions attached to the first major surface of the conductive plate, wherein each conductive extension extends from the first major surface of the conductive plate and between two wire bonds of the plurality of wire bonds, wherein each of the plurality of extensions comprises a first sidewall adjacent a first wire bond and a second sidewall adjacent a second wire bond that is directly adjacent the first wire bond.

2. The semiconductor device of claim 1, wherein each of the plurality of conductive extensions extends between two wire bonds of the plurality of wire bonds to the first major surface of the package substrate.

3. The semiconductor device of claim 1, wherein each extension is electrically coupled to the conductive plate and the conductive plate is electrically coupled to a first voltage supply node of the package substrate.

4. The semiconductor device of claim 1, further comprising:
   a second plurality of extensions attached to the first major surface of the conductive plate which extend to contact a conductive landing pad on the semiconductor die.

5. The semiconductor device of claim 1, wherein each of the plurality of conductive extensions comprises a wire which extends from the first major surface of the conductive plate and between two wire bonds of the plurality of wire bonds.

6. The semiconductor device of claim 5, wherein each wire extends to the first major surface of the package substrate.

7. The semiconductor device of claim 5, wherein each wire loops back to the first major surface of the conductive plate and is connected, at both ends, to the first major surface of the conductive plate.

8. The semiconductor device of claim 7, wherein each wire that loops back to the first major surface of the conductive plate contacts conductive epoxy on the first major surface of the package substrate.

9. The semiconductor device of claim 5, wherein each wire is electrically connected to the first major surface of the conductive plate and wherein the conductive plate is coupled to a first voltage supply node of the package substrate.

10. The semiconductor device of claim 1, wherein each extension includes a solid conductive material between the first and second sidewall.

11. The semiconductor device of claim 1, wherein each extension has a wedge shape between the first and second wire bonds.

12. A method for forming a semiconductor device, the method comprising:
   forming a conductive plate having conductive extensions on a first major surface of the conductive plate; and
   after forming the conductive plate having the conductive extensions, placing the plate over a package substrate having a semiconductor die attached to a first major surface of the package substrate, and a plurality of wire bonds attached between the semiconductor die and the first major of the package substrate, wherein placing the plate is performed such that the first major surface of the conductive plate faces the first major surface of the package substrate and at least one extension of the conductive plate extends between two directly adjacent wire bonds of the plurality of wire bonds.

13. The method of claim 12, wherein placing the plate over the package substrate is performed such that each of the plurality of conductive extensions extends between two wire bonds of the plurality of wire bonds and contacts the first major surface of the package substrate.

14. The method of claim 12, wherein, after placing the plate, each extension is electrically coupled to the conductive plate and the conductive plate is electrically coupled to a first voltage supply node of the package substrate.

15. The method of claim 12, wherein forming the conductive plate comprises:
   forming the conductive extensions by wire bonding wires onto the first major surface of the conductive plate.

16. The method of claim 12, wherein forming the conductive plate comprises:
   forming the conductive extensions by attaching conductive fins onto the first major surface of the conductive plate.

17. The method of claim 12, wherein placing the conductive plate over the package substrate is performed using a pick-and-place machine.

18. A semiconductor device, comprising:
   a package substrate;
   a semiconductor die attached to a first major surface of the package substrate;
   a plurality of wire bonds attached between the semiconductor die and the first major surface of the package substrate;
   a conductive plate over the semiconductor die, plurality of wire bonds, and package substrate wherein a first major surface of the conductive plate faces the first major surface of the package substrate;
   a plurality of conductive extensions attached to the first major surface of the conductive plate and electrically coupled to the conductive plate, wherein each conductive extension includes a wire which extends from the first major surface of the conductive plate and between two wire bonds of the plurality of wire bonds, wherein, each wire loops back to the first major surface of the conductive plate and is connected, at both ends, to the first major surface of the conductive plate.

* * * * *